(12) United States Patent
Selvamanickam et al.

(10) Patent No.: US 7,417,192 B2
(45) Date of Patent: Aug. 26, 2008

(54) SUPERCONDUCTOR COMPONENTS

(75) Inventors: Venkat Selvamanickam, Wynantskill, NY (US); Yi-Yuan Xie, Guilderland, NY (US)

(73) Assignee: Superpower, Inc., Schenectady, NY (US)

( * ) Notice: Subject to any disclaimer, the term of this patent is extended or adjusted under 35 U.S.C. 154(b) by 0 days.

(21) Appl. No.: 11/233,389

(22) Filed: Sep. 22, 2005

(65) Prior Publication Data

US 2007/0232500 A1 Oct. 4, 2007

Related U.S. Application Data

(60) Provisional application No. 60/612,058, filed on Sep. 22, 2004.

(51) Int. Cl.
*H01B 12/00* (2006.01)
(52) U.S. Cl. .................. 174/125.1; 174/15.4; 505/230
(58) Field of Classification Search .............. 174/125.1, 174/15.4, 15; 257/661–663; 505/230, 231, 505/704, 925, 926
See application file for complete search history.

(56) References Cited

U.S. PATENT DOCUMENTS

| | | | | |
|---|---|---|---|---|
| 5,051,397 | A * | 9/1991 | Sato et al. ................. | 505/230 |
| 5,077,266 | A | 12/1991 | Takagi et al. | |
| 5,358,929 | A | 10/1994 | Fujikami et al. | |
| 5,527,766 | A | 6/1996 | Eddy | |
| 5,592,087 | A | 1/1997 | Richard et al. | |
| 5,650,377 | A | 7/1997 | Kern et al. | |
| 5,932,523 | A * | 8/1999 | Fujikami et al. ........... | 505/231 |
| 6,133,814 | A | 10/2000 | Okada et al. | |
| 6,190,752 | B1 | 2/2001 | Do et al. | |
| 6,388,268 | B1 | 5/2002 | Kim et al. | |
| 6,436,317 | B1 | 8/2002 | Malozemoff et al. | |
| 6,576,843 | B1 | 6/2003 | Asworth | |
| 6,765,151 | B2 * | 7/2004 | Fritzemeier et al. ...... | 174/125.1 |
| 6,794,970 | B2 | 9/2004 | Reis et al. | |
| 2004/0020683 | A1 * | 2/2004 | Perez et al. .............. | 174/125.1 |
| 2004/0256126 | A1 * | 12/2004 | Ashibe et al. ............. | 174/15.5 |
| 2004/0266628 | A1 | 12/2004 | Lee et al. | |
| 2005/0139380 | A1 | 6/2005 | Knoll et al. | |
| 2006/0175078 | A1 * | 8/2006 | Yumura et al. ........... | 174/125.1 |

FOREIGN PATENT DOCUMENTS

| | | |
|---|---|---|
| JP | 01-107582 | 4/1989 |
| JP | 3-283679 | 12/1991 |
| JP | 6-85337 | 3/1994 |

(Continued)

OTHER PUBLICATIONS

U.S. Appl. No. 10/750,144, filed Dec. 21, 2003, Allan Robert Knoll et al.

(Continued)

*Primary Examiner*—Dean A. Reichard
*Assistant Examiner*—Yuriy Semenenko
(74) *Attorney, Agent, or Firm*—Larson Newman Abel Polansky & White, LLP

(57) ABSTRACT

A superconductor component is disclosed, which notably includes a superconducting conductor, the conductor including a core and superconductor layer overlying the core. The core generally has a circular cross-section, and the superconductor layer may cover a substantial portion of the core.

15 Claims, 6 Drawing Sheets

FOREIGN PATENT DOCUMENTS

| | | |
|---|---|---|
| JP | 2000-261053 | 9/2000 |
| JP | 2001-168404 | 6/2001 |
| WO | WO 01/08232 A2 | 2/2001 |
| WO | WO 01/18885 A1 | 3/2001 |
| WO | WO 01/26165 A2 | 4/2001 |
| WO | WO 2005/089095 A2 | 9/2005 |
| WO | WO 2007/001383 A2 | 1/2007 |

OTHER PUBLICATIONS

Pedarnig, J.D., et al., "Patterning of YBa2Cu3O7—Films using a Near-Field Optical Configuration", Appl. Phys. A., vol. 67, pp. 403-405, 1998.

Cobb, Coleman B., et al., "Hysteretic Loss Reduction in Striated YBCO", Physica C., vol. 382, pp. 52-56, 2002.

Carr, Jr., W.J., et al., "Filamentary YBCO Conductors for AC Applications", IEEE Transactions on Applied Superconductivity, vol. 9, No. 2, pp. 1475-1478, Jun. 1999.

Sumption, M.D., et al., Hysteretic Loss vs. Filament Width in Thin YBCO Films Near the Penetration Field, IEEE Transactions on Applied Superconductivity, vol. 13., No. 2, pp. 3553-3556, Jun. 2003.

Suzuki, Y., "Transport Properties of Patterned Thin Lines From Epitaxial YBCO", Cornell Nanofabrication Facility, National Nabnofabrication Users Network, pp. 178-179.

Meltaus, J., et al., "High Temperature Superconducting Thin-Film Patterning for Microwave Applications", Materials Physics Laboratory, Helsinki University of Technology, 1 pg.

Hakola, A., "Patterning of HTS Thin Films", Department of Engineering Physics and Mathematics, Helsinki University of Technology, http://www.hut.fi/Units/AES/projects/prlaser/patterning.htm, 2 pgs.

"State-of-the-art of the HTS Microfabrication Technology", http://www.imel.demokritos.gr/web/NATO_973718/Proposal/stateoftheart_ofHTStechnol..., 4 pgs, Jul. 17, 2003.

Tralshawala, N., et al., "Session K20—Industrial Applications of High-Temperature Superconductor Materials", Mixed Session, Wednesday afternoon, Mar. 19, 5 pgs.

* cited by examiner

SUPERCONDUCTOR COMPONENTS

CROSS-REFERENCE TO RELATED APPLICATION(S)

This application claims priority to U.S. Provisional Application 60/612,058, filed Sep. 22, 2004, the subject matter thereof being incorporated herein by reference in its entirety.

BACKGROUND

1. Field of the Invention

The present invention generally relates to superconductor components, and in particular, second generation, high-temperature superconductor components.

2. Description of the Related Art

Superconductor materials have long been known and understood by the technical community. Low-temperature (low-$T_c$) superconductors exhibiting superconductive properties at temperatures requiring use of liquid helium (4.2 K), have been known since about 1911. However, it was not until somewhat recently that oxide-based high-temperature (high-$T_c$) superconductors have been discovered. Around 1986, a first high-temperature superconductor (HTS), having superconductive properties at a temperature above that of liquid nitrogen (77 K) was discovered, namely $YBa_2Cu_3O_{7-x}$ (YBCO), followed by development of additional materials over the past 15 years including $Bi_2Sr_2Ca_2Cu_3O_{10+y}$ (BSCCO), and others. The development of high-$T_c$ superconductors has brought potential, economically feasible development of superconductor components incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the inherent resistance of copper-based commercial power components is responsible for quite significant losses in electricity, and accordingly, the power industry stands to gain significant efficiencies based upon utilization of high-temperature superconductors in power components such as transmission and distribution power cables, generators, transformers, and fault current interrupters. In addition, other benefits of high-temperature superconductors in the power industry include an increase in one to two orders of magnitude of power-handling capacity, significant reduction in the size (i.e., footprint) of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the many challenges associated with the commercialization of high-temperature superconductors, many exist around the fabrication of a superconducting tape that can be utilized for formation of various power components. A first generation of superconducting tape includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of hundreds of meters), due to materials and manufacturing costs, such tapes do not represent a commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an electrical stabilizer layer overlying the superconductor layer, typically formed of at least a noble metal. However, to date, numerous engineering and manufacturing challenges remain prior to full commercialization of such second generation-tapes.

Accordingly, in view of the foregoing, various needs continue to exist in the art of superconductors, and in particular, provision of commercially viable superconducting conductors, methods for forming same, and power components utilizing such superconducting conductors.

SUMMARY

According to one aspect, a superconductor component is provided that includes a superconducting conductor, the conductor comprising a core and a superconductor layer overlying the core. Here, the core is in the form of a conductive wire having a generally circular cross-section, and the superconductor layer is generally continuous and covers at least 60% of the outer surface area of the core.

According to another aspect, a superconductor component is provided that includes a superconducting conductor, the conductor comprising a core and a superconductor layer overlying the core. Here, the core is in the form of a conductive wire having a generally circular cross-section and having a longitudinal axis, and the superconductor layer is layer is in the form of an extended sheet having a longitudinal axis, the sheet being wrapped around and being bonded to the core such that the longitudinal axes of the core and the superconductor layer are generally parallel to each other.

According to another aspect, a superconductor component is provided that includes a superconducting conductor, the conductor comprising a core and a superconductor layer overlying the core. Here, the core is in the form of a conductive wire having a generally circular cross-section and having a diameter not greater than 50 mm.

According to another aspect, a superconductor component is provided that includes a superconducting conductor, the conductor comprising a core and a superconductor assembly overlying the core. Here, the core is in the form of a conductive wire having a generally circular cross-section, and the superconductor assembly is includes a superconductor layer overlying a substrate. The superconductor assembly is bonded to the core such that the superconductor layer is radially closer to the core than the substrate.

According to another aspect, a superconductor component is provided that includes a superconducting conductor, the conductor comprising a core and a superconductor assembly overlying the core. The core is in the form of a conductive wire having a generally circular cross-section, a longitudinal axis, an electrical resistivity not greater than 10 $\mu\Omega\cdot cm$, and a diameter not greater than 50 mm. The superconductor assembly includes a superconductor layer overlying a substrate, the assembly having a longitudinal axis, and being bonded to the core such that (i) the superconductor layer is radially closer to the core than the substrate, (ii) the superconductor layer is in compression, (iii) the superconductor layer covers at least 60% of the outer surface area of the core as projected radially onto the core, (iv) is in electrical contact with the core, and (v)

the longitudinal axes of the core and the superconductor layer are generally parallel to each other.

DESCRIPTION OF THE PREFERRED EMBODIMENT(S)

Figure 1:
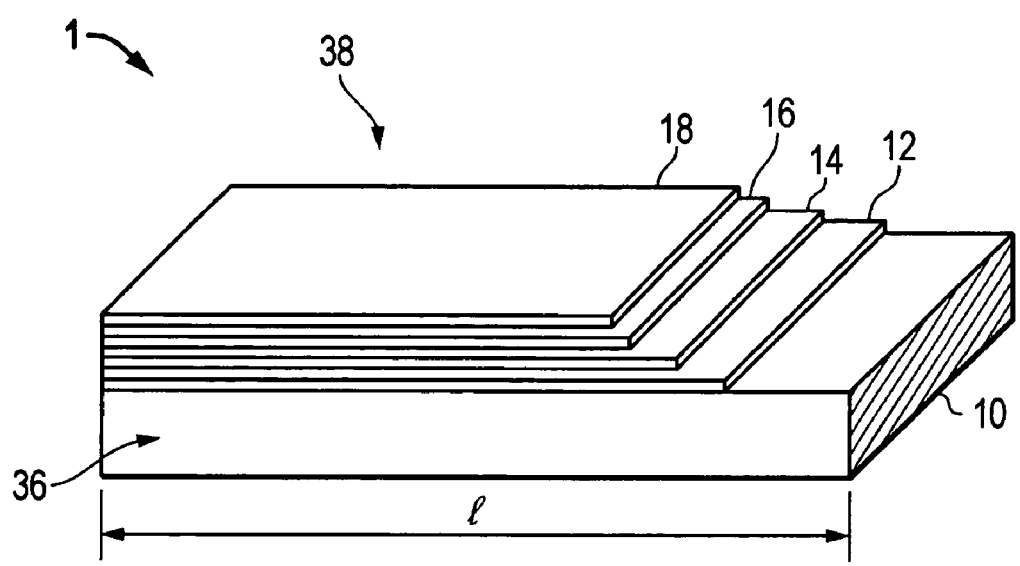
FIG. 1 illustrates the general layered structure of a superconductive assembly that is utilized in the fabrication of embodiments of the present invention.

Turning to FIG. 1, the general layered structure of a superconductive assembly 1 according to an embodiment of the present invention is depicted. The superconductive assembly 1 includes a substrate 10, a buffer layer 12 overlying the substrate 10, a superconductor layer 14, followed by a capping layer 16, typically a noble metal layer, and a bonding layer 18, such as a solder. This assembly may be used in the formation of a superconductive conductor according to particular aspects of the present invention described in more detail below.

The substrate 10 is generally metal-based, and typically, an alloy of at least two metallic elements. Particularly suitable substrate materials include nickel-based metal alloys such as the known Inconel® group of alloys. The Inconel® alloys tend to have desirable creep, chemical and mechanical properties, including coefficient of expansion, tensile strength, yield strength, and elongation. These metals are generally commercially available in the form of spooled tapes, particularly suitable for superconductor tape fabrication, which typically will utilize reel-to-reel tape handling.

The substrate 10 is typically in a tape-like configuration, having a high dimension ratio. For example, the width of the tape is generally on the order of about 0.4-10 cm, and the length of the tape is typically at least about 100m, most typically greater than about 500m. Indeed, embodiments of the present invention provide for superconducting tapes that include substrate 10 having a length on the order of 1 km or above. Accordingly, the substrate may have a dimension ratio which is fairly high, on the order of not less than 10, not less than about $10^2$, or even not less than about $10^3$. Certain embodiments are longer, having a dimension ratio of $10^4$ and higher. As used herein, the term 'dimension ratio' is used to denote the ratio of the length of the substrate or tape to the next longest dimension, the width of the substrate or tape.

In one embodiment, the substrate is treated so as to have desirable surface properties for subsequent deposition of the constituent layers of the superconductor tape. For example, the surface may be lightly polished to a desired flatness and surface roughness. Additionally, the substrate may be treated to be biaxially textured as is understood in the art, such as by the known RABiTS (rolling assisted biaxially textured substrate) technique.

Turning to the buffer layer 12, the buffer layer may be a single layer, or more commonly, be made up of several films. Most typically, the buffer layer includes a biaxially textured film, having a crystalline texture that is generally aligned along crystal axes both in-plane and out-of-plane of the film. Such biaxial texturing may be accomplished by IBAD. As is understood in the art, IBAD is acronym that stands for ion beam assisted deposition, a technique that may be advantageously utilized to form a suitably textured buffer layer for subsequent formation of a superconductor layer having desirable crystallographic orientation for superior superconducting properties. Magnesium oxide is a typical material of choice for the IBAD film, and may be on the order or 50 to 500 Angstroms, such as 50 to 200 Angstroms. Generally, the IBAD film has a rock-salt like crystal structure, as defined and described in U.S. Pat. No. 6,190,752, incorporated herein by reference.

The buffer layer may include additional films, such as a barrier film provided to directly contact and be placed in between an IBAD film and the substrate. In this regard, the barrier film may advantageously be formed of an oxide, such as alumina or yttria, and functions to isolate the substrate from the IBAD film. A barrier film may also be formed of non-oxides such as silicon nitride. Suitable techniques for deposition of a barrier film include chemical vapor deposition and physical vapor deposition including sputtering. Typical thicknesses of the barrier film may be within a range of about 100-200 Angstroms. Still further, the buffer layer may also include an epitaxially grown film, formed over the IBAD film. In this context, the epitaxially grown film is effective to increase the thickness of the IBAD film, and may desirably be made principally of the same material utilized for the IBAD layer such as MgO.

In embodiments utilizing an MgO-based IBAD film and/or epitaxial film, a lattice mismatch between the MgO material and the material of the superconductor layer exists. Accordingly, the buffer layer may further include another buffer film, this one in particular implemented to reduce a mismatch in lattice constants between the superconductor layer and the underlying IBAD film and/or epitaxial film. This buffer film may be formed of materials such as YSZ (yttria-stabilized zirconia) strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABiTS (rolling assisted biaxially textured substrates), generally understood in the art.

The superconductor layer 14 is generally in the form of a high-temperature superconductor (HTS) layer. HTS materials are typically chosen from any of the high-temperature superconducting materials that exhibit superconducting properties above the temperature of liquid nitrogen, 77K. Such materials may include, for example, $YBa_2Cu_3O_{7-x}$, $Bi_2Sr_2Ca_2Cu_3O_{10+y}$, $Tl_2Ba_2Ca_2Cu_3O_{10+y}$, and $HgBa_2Ca_2Cu_3O_{8+y}$. One class of materials includes $REBa_2Cu_3O_{7-x}$, wherein RE is a rare earth element. Of the foregoing, $YBa_2Cu_3O_{7-x}$, also generally referred to as YBCO, may be advantageously utilized. The superconductor layer 14 may be formed by any one of various techniques, including thick and thin film forming techniques. Preferably, a thin film physical vapor deposition technique such as pulsed laser deposition (PLD) can be used for a high deposition rates, or a chemical vapor deposition technique can be used for lower cost and larger surface area treatment. Typically, the superconductor layer has a thickness on the order of about 1 to about 30 microns, most typically about 2 to about 20 microns, such as about 2 to about 10 microns, in order to get desirable amperage ratings associated with the superconductor layer 14.

The capping layer 16 is typically formed of a noble metal to prevent unwanted contamination of superconductor layer 14, such as by diffusion of poisoning components into the superconductor layer from additional materials/layers in the final conductor structure. Typical noble metals include gold, silver, platinum, and palladium. Silver is generally used due to its cost and general accessibility. The capping layer 16 is typically made to be thick enough to prevent unwanted diffusion of the components into the superconductor layer 14, but is made to be generally thin for cost reasons (raw material and processing costs). Typical thicknesses of the capping layer 16 range within about 0.1 to about 10.0 microns, such as 0.5 to about 5.0 microns. Various techniques may be used for deposition of the capping layer 16, including physical vapor deposition, such as DC magnetron sputtering.

Figure 2:
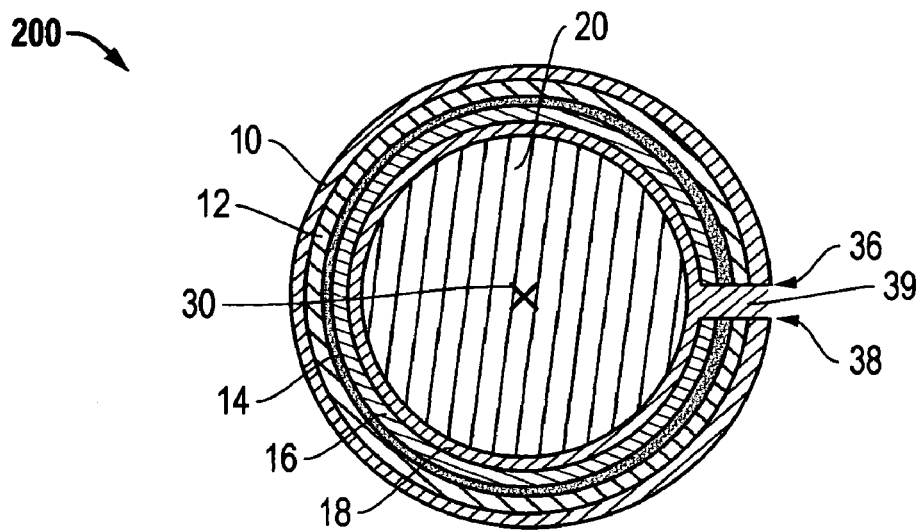
FIGS. 2 and 3 illustrate first and second embodiments of the present invention.

According to exemplary superconducting structures, the next layer overlying a capping layer is typically a conductive stabilizer layer. Conductive stabilizers are generally formed by depositing copper to overlie the capping layer. In this context, the stabilizer layer functions as a low resistance interface for electrical stabilization to aid in prevention of superconductor burn out during use. That is, such stabilizer layers aid in the continued flow of electrical charges along the superconductive assembly in cases where cooling fails or the critical current density is exceeded such that the superconductor layer becomes resistive. In particular embodiments illustrated in FIGS. 1 and 2, the stabilizer layer is not included in the superconductive assembly, and the functionality of the stabilizer layer is provided by a core 20 as shown in FIG. 2. Alternatively, in certain embodiments, a stabilizer is incorporated to aid in current carrying capability from one layer to another within the structure.

More specifically, in reference to FIGS. 1 and 2, the structure of a superconducting conductor 200 is illustrated which notably includes the superconductive assembly 1, positioned so as to wrap around core 20. Here, the layered, high aspect ratio tape configuration of the superconductive assembly 1 is positioned so as to encircle core 20. FIG. 2 illustrates a cross-section of the conductor 200, having a longitudinal axis 30 aligned so as to be generally parallel with the longitudinal axis 1 of the superconductive assembly shown in FIG. 1. As such, the first and second opposite lateral sides 36, 38 of the assembly 1 are generally disposed so as to face each other and provide therebetween a gap 39. In the embodiment shown in FIG. 2, the material of the solder layer 19 utilized to bond the assembly 1 to the core 20, also extends into the gap 39. As should be clear, the gap 39 generally extends along a length of the conductor 200, and extends generally parallel to the longitudinal axis 30 of the core 20 as well as the longitudinal axis 1 of the assembly 1.

The core 20 shown in FIG. 2 has a generally circular cross-section. As used herein, 'generally circular cross section' includes cross sections perpendicular to the longitudinal axis of varying geometries, including ovals and the like. In this regard, the cross section of the core 20 perpendicular to the longitudinal axis 1 generally has an aspect ratio within a range of 1:1 to 1:1.5. According to one feature, the solder layer 18 ensures electrical contact between the core 20 and the superconductor layer 14 (through the capping layer 16).

Accordingly, the core desirably functions as an electrical shunt as described above with respect to conventional stabilizer layers. To effect bonding of the assembly 1 to the core 20 with a high degree of mechanical stability and electrical conductivity, various solders may be used, such as indium, lead-tin, indium-tin solders and combinations thereof. In particular, solder may include indium and indium-based alloys, which provide requisite mechanical bonding strength and desirably low electrical resistivity. In a similar manner, the core is generally also formed of a material having low electrical resistivity, typically not greater than about 10 μΩ·cm, such as not greater than about 5 μΩ·cm. Suitable materials include aluminum, aluminum alloys, as well as copper and copper alloys. Copper is notably widely available in grades suitable for current carrying use.

Bonding may be effected by wrapping the assembly 1 around the core 20, followed by application of pressure and heat, such as on the order of about 250° C. in the case of indium solder. Additional solder material may be provided along the gap 39, which may be optionally aligned with material forming the capping layer. The implementation of solder extending along gap 39 has additional benefits, including electrical continuity in embodiments utilizing additional superconducting layers (FIG. 3), and electrical continuity in embodiments utilizing a striated structure (FIG. 4), discussed in more detail below.

As noted above, the assembly 1 is wrapped around the core 20 in a manner so as to generally leave behind a gap. Projected radially, the assembly 1, and particularly the superconductor layer 14, shown here in the form of a single continuous sheet of superconductor material (i.e., generally not multiple sheets of material or tapes in a single layer), covers most of the outer circumferential surface of the core 30, at least along a substantial length of the core 20, generally along a majority of its length. Typically, the superconductor layer covers at least 60% of the outer surface of the core, more typically, at least about 70%, such as at least about 80% of the surface area of the core.

Due to the manner in which the assembly is wrapped around and bonded to the core 20, several advantages may be realized. Generally, the assembly is bonded to the core 20 such that the solder layer is the radially most interior layer, followed by the capping layer 16, the superconductor layer 14, the buffer layer 12, and finally the substrate 10. As such, the superconductor layer 14 is provided in compression; in particular, at least the radially inner major surface facing the core 20 is in compression. Implementation of a compressive stress into the superconductor layer 14 enables formation of compact, dense conductors, having relatively diminutive core diameters. More concretely, the superconductor layer 14 may be disposed on significantly smaller diameter cores when placed in compressive stress rather than tensile stress (e.g., the substrate being radially closer to the core than the superconductor layer). In this regard, certain embodiments call for relatively limited core diameters, such as not greater than about 50 millimeters, not greater than about 25 millimeters, 20 millimeters, 15 millimeters, and even not greater than about 10 millimeters.

According to another feature of the embodiment illustrated in FIGS. 1 and 2, the c-axis of the superconductor layer 14 is disposed in manner such that it extends radially around the core 20, whereby the a-b crystal plane (the desirably superconducting plane) extends parallel to the longitudinal axis 30, that is, along the desired current carry direction. This is a preferable conductor architecture to minimize effects of anisotropy that is generally inherent in superconducting materials, such as those mentioned above.

Figure 3:
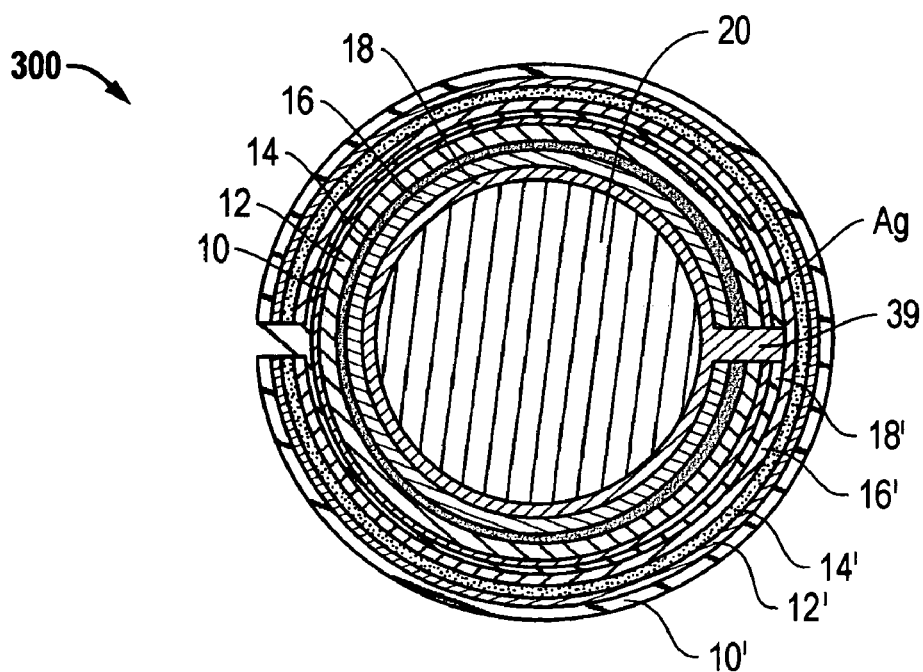

Turning to FIG. 3, another embodiment is illustrated which includes first and second superconducting layers 14 and 14', effectively increasing the current carrying capability of the conductor 300. Here, a second superconductive assembly, essentially identical to the first, optionally having an increased width so as to maintain a similar gap size, is wrapped so as to circumferentially surround the first assembly. As should be clear, the second assembly includes a substrate 10', buffer layer 12', superconductor layer 14', capping layer 16', and solder layer 18'. As noted above, the solder extending axially as well as radially along gap 39 functions to electrically interconnect the first and second assemblies, ensuring electrical connection to superconductor layers 14 and 14' to the core 20.

As also shown in FIG. 3, the seam or gap associated with the second assembly is placed in an azimuthal direction away from the first seam or gap 39. In the example shown in FIG. 3, the gap is placed diametrically opposite the gap of the first assembly. Additional superconductive assemblies, each having additional superconductor layers, may be wrapped over the two assemblies shown in FIG. 3, and the seam or gaps are generally spaced apart from each other circumferentially. In another configuration, a wide tape can be wrapped around the core in multiple layers in order to support higher engineering current densities.

Figure 4:
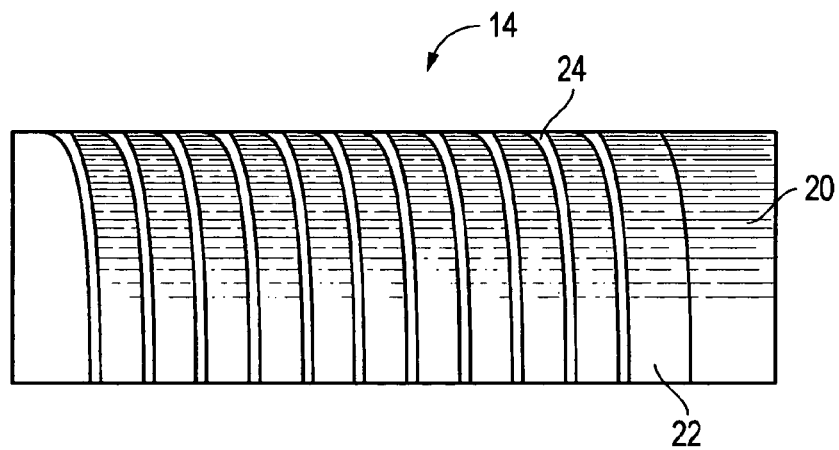
FIG. 4 illustrates a particular structure of a superconductor layer according to an embodiment of the present invention.

FIG. 4 illustrates a particular configuration of the superconductor layer 14 provided so as to be wrapped around core 20. Here, superconductor layer 14 is patterned to have superconductive filaments 22 which are generally coextensive of each other and which are separated from each other by non-superconducting portions or borders 24 which may be embodied as voids, optionally filled with non-superconducting material. In this regard, portions 24 have an important function of subdividing current flow to appreciably prevent current flow from one filament to the next filament longitudinally along the conductor and across portions 24. Rather, electrical continuity is ensured by provision of conductive materials such as solder in gap 39 shown in the prior figures. As illustrated, the filaments 22 are essentially discrete, curved filaments extending along a circumferential direction of the conductor, non-parallel to the longitudinal axis of the conductor. By forming a structure combining such filaments and electrical interconnection such as through the conductive bridge embodied as a solder material in gap 39, a helical current flow path is defined, such that AC losses may be minimized. For further information on the fabrication of filaments as well as AC loss reduction, reference is made to co-pending application Ser. No. 10/750,144, filed Dec. 31, 2003.

Figure 5:
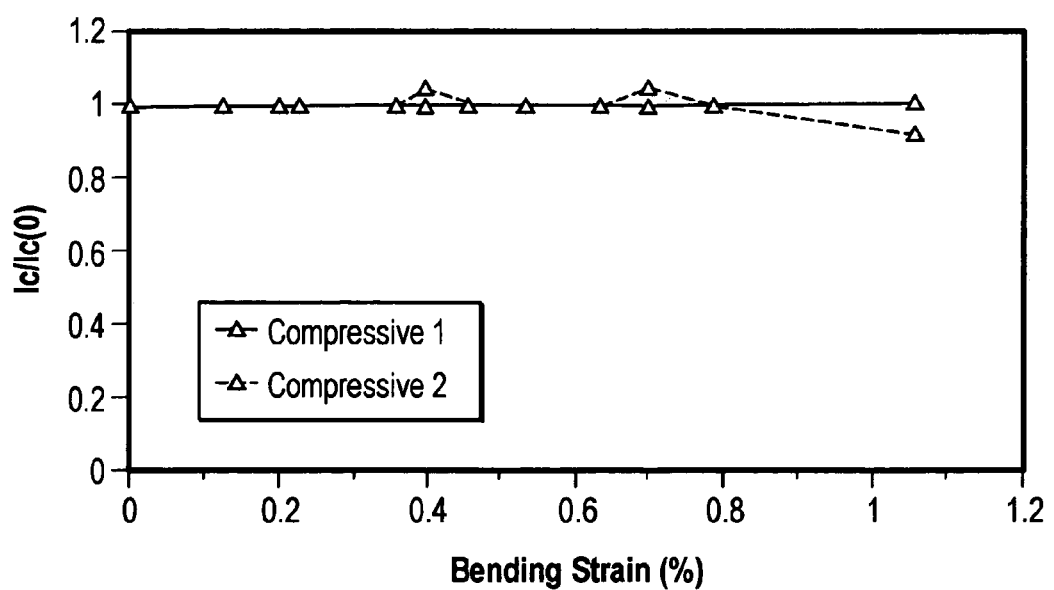
FIG. 5 illustrates the impact on $J_c$ due to bending strain.

FIG. 5 shows results from measurements on the affect of compressive bend strain of the superconductor layer 14 on $J_c$. The conductor was found to withstand compressive bend strains of 1.1% with minimal degradation in $J_c$. For a 107 μm thick superconductive assembly, this corresponds to wrapping the conductor around a 10 millimeter diameter core. Accordingly, orientation of the superconductive assembly 1 around core 20 not only provides mechanical stability, but also electrical stability and retention of high $J_c$.

Figure 6:
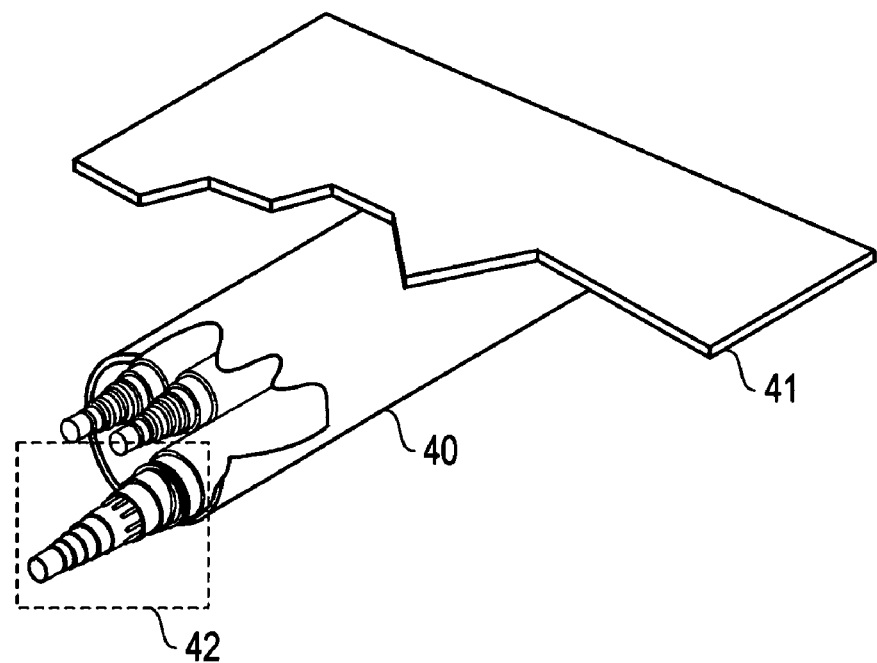
FIGS. 6 and 7 illustrate power cables incorporating conductors according to embodiments of the present invention.
Figure 7:
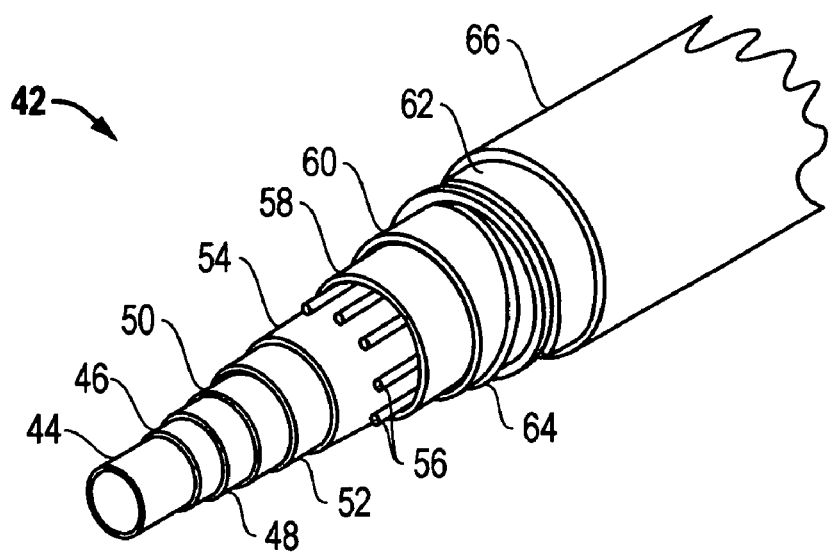

Moving away from the particular structure of the superconducting tape, FIGS. 6 and 7 illustrate implementation of a superconducting conductor in a commercial power component, namely a power cable. FIG. 6 illustrates several power cables 42 extending through an underground conduit 40, which may be a plastic or steel conduit. FIG. 6 also illustrates the ground 41 for clarity. As is shown, several power cables may be run through the conduit 40.

Turning to FIG. 7, a particular structure of a power cable is illustrated. In order to provide cooling to maintain the superconductive power cable in a superconducting state, liquid nitrogen is fed through the power cable through LN2 duct 44. One or a plurality of HTS conductors 46 is/are provided so as to cover the duct 44. While conventional tapes are generally placed onto the duct 44 in a helical manner, the conductors according to embodiments of the present invention need not be helically wound, but, in other embodiments, may extend linearly, parallel to the longitudinal axis of the power cable. Further components include a copper shield 48, a dielectric tape 50 for dielectric separation of the components, a second HTS tape 52, a copper shield 54 having a plurality of centering wires 56, a second, larger LN2 duct 58, thermal insulation 60, provided to aid in maintaining a cryogenic state, a corrugated steel pipe 62 for structural support, including skid wires 64, and an outer enclosure 66.

Figure 8:
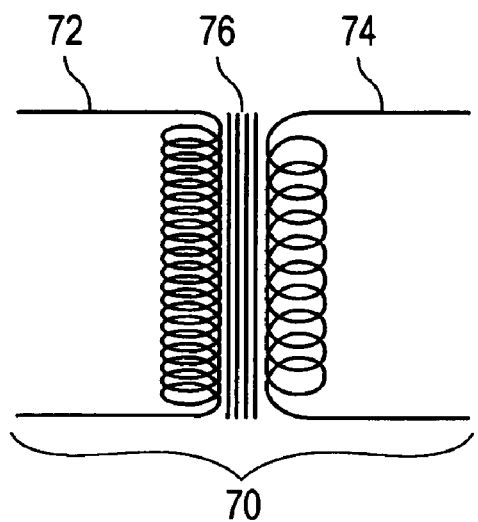
FIG. 8 illustrates a schematic of a power transformer according to an embodiment.
Figure 9:
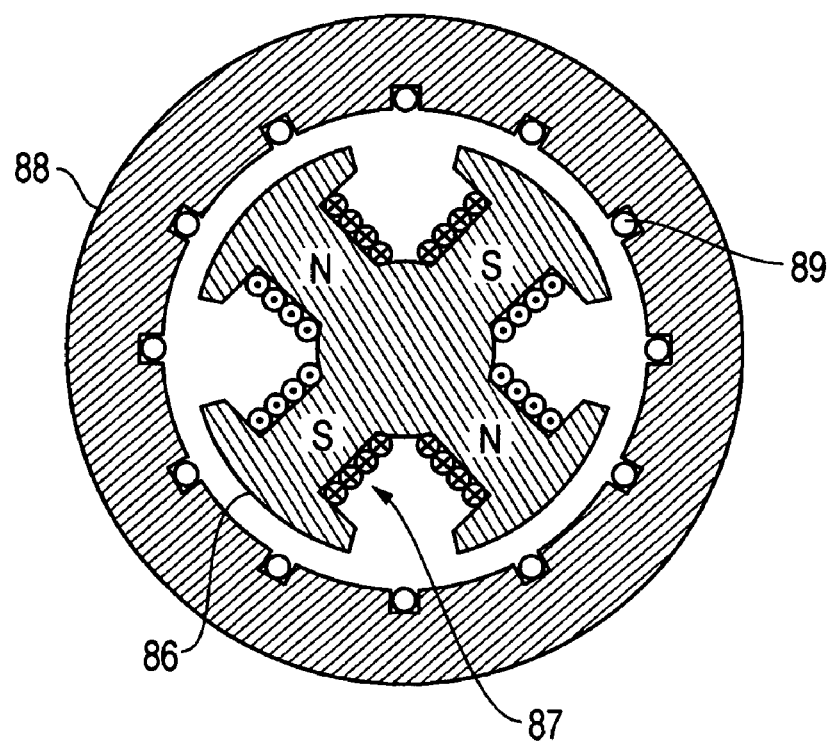
FIG. 9 illustrates a rotating machine according to another embodiment of the present invention.

FIG. 8 illustrates schematically a power transformer having a central core 76 around which a primary winding 72 and a secondary winding 74 are provided. It is noted that FIG. 8 is schematic in nature, and the actual geometric configuration of the transformer may vary as is well understood in the art. However, the transformer includes at least the basic primary and secondary windings. In this regard, in the embodiment shown in FIG. 8, the primary winding has a higher number of coils than the secondary winding 74, representing a step-down transformer that reduces voltage of an incoming power signal. In reverse, provision of a fewer number of coils in the primary winding relative to the secondary winding provides a voltage step-up. In this regard, typically step-up transformers are utilized in power transmission substations to increase voltage to high voltages to reduce power losses over long distances, while step-down transformers are integrated into distribution substations for later stage distribution of power to end users. At least one of and preferably both the primary and secondary windings comprise superconductive conductors in accordance with the foregoing description Turning to FIG. 9, the basic structure of a generator is provided. The generator includes a rotor 86 that is driven as is known in the art, such as by a turbine. Rotor 86 includes high-intensity electromagnets, which are formed of rotor coils 87 that form the desired electromagnetic field for power generation. The generation of the electromagnetic field generates power in the stator 88, which comprises at least one conductive winding 89. According to a particular feature of the embodiment, the rotor coils and/or the stator winding comprises a superconductive conductor in accordance with embodiments described above. Low loss superconductors used in the stator windings generally substantially reduce hysteresis losses.

Figure 10:
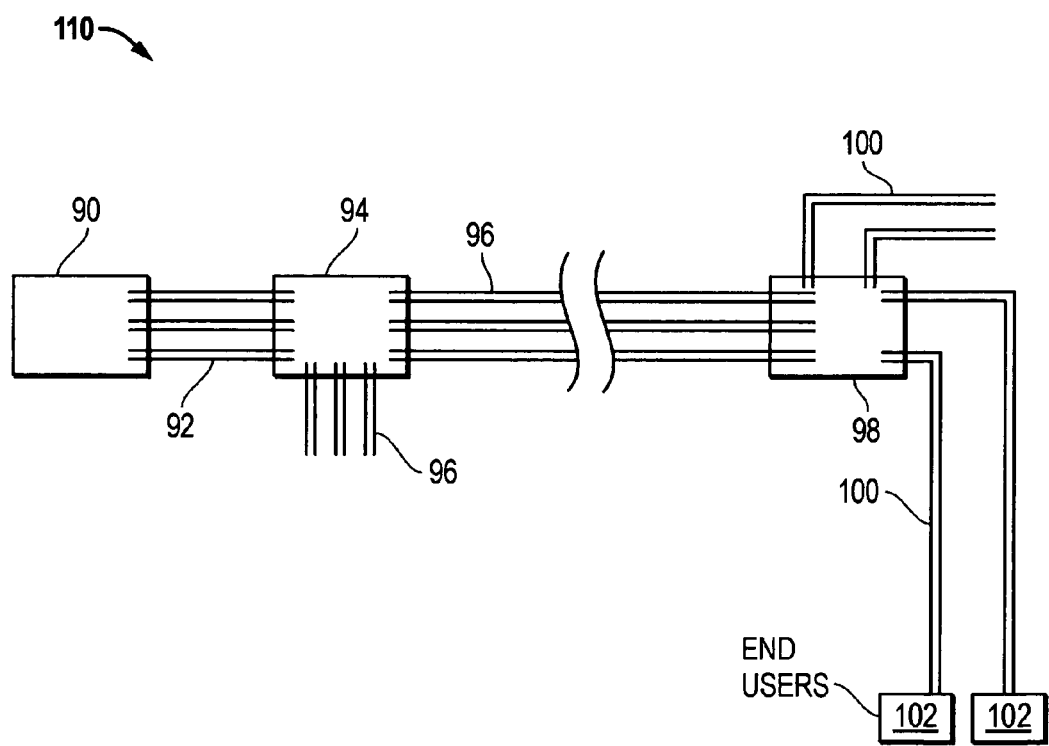
FIG. 10 illustrates a general schematic of a power grid according to an embodiment of the present invention.

Turning to FIG. 10, a basic schematic of a power grid is provided. Fundamentally, the power grid 110 includes a power plant 90 typically housing a plurality of power generators. The power plant 90 is electrically connected and typically co-located with a transmission substation 94. The transmission substation contains generally a bank of step-up power transformers, which are utilized to step-up voltage of the generated power. Typically, power is generated at a voltage level on the order of thousands of volts, and the transmission substation functions to step-up voltages are on the order of 100,000 to 1,000,000 volts in order to reduce line losses. Typical transmission distances are on the order of 50 to 1,000 miles, and power is carried along those distances by power transmission cables 96. The power transmission cables 96 are routed to a plurality of power substations 98 (only one shown in FIG. 10). The power substations contain generally a bank of step-down power transformers, to reduce the transmission level voltage from the relatively high values to distribution voltages, typically less than about 10,000 volts. A plurality of further power substations may also be located in a grid-like fashion, provided in localized areas for localized power distribution to end users. However, for simplicity, only a single power substation is shown, noting that downstream power substations may be provided in series. The distribution level power is then transmitted along power distribution cables 100 to end users 102, which include commercial end users as well as residential end users. It is also noted that individual transformers may be locally provided for individual or groups of end users. According to a particular feature, at least one of the generators provided in the power plant 90, the transformers and the transmission substation, the power transmission cables, the transformers provided in the power substation, and the power distribution cables contain superconductive tapes in accordance with the present description.

While the invention has been illustrated and described in the context of specific embodiments, it is not intended to be limited to the details shown, since various modifications and substitutions can be made without departing in any way from the scope of the present invention. For example, additional or equivalent substitutes can be provided and additional or equivalent production steps can be employed. As such, further modifications and equivalents of the invention herein disclosed may occur to persons skilled in the art using no more than routine experimentation, and all such modifications and equivalents are believed to be within the scope of the invention as defined by the following claims.

The invention claimed is:

1. A superconductor component comprising:
    a superconducting conductor, the conductor comprising a core and a superconductor assembly overlying the core, wherein:
    the core is in the form of a conductive wire having a generally circular cross-section and a longitudinal axis; and
    the superconductor assembly includes a superconductor layer overlying a substrate, the superconductor assembly in the form of a tape having first and second opposite lateral sides, the tape being wrapped around and bonded to the core such that the lateral sides are spaced circumferentially apart from each other forming a gap, the gap having a longitudinal axis extending generally parallel to the longitudinal axis of the core, wherein the superconductor layer is continuous and covers at least 60% of the outer surface area of the core.

2. The superconductor component of claim 1, wherein the superconductor layer covers at least 70% of the outer surface area of the core.

3. The superconductor component of claim 1, the superconductor layer covers at least 60% of the outer surface area of the core as projected radially onto the core.

4. The superconductor component of claim 1, wherein the core comprises Al or Cu.

5. The superconductor component of claim 1, wherein the core comprises Cu.

6. The superconductor component of claim 1, wherein the core has an electrical resistivity not greater than about 10 $\mu\Omega$·cm.

7. The superconductor component of claim 1, further comprising a capping layer provided to overlie the superconductor layer, the capping layer being positioned between the core and the superconductor layer.

8. The superconductor component of claim 1, wherein the superconductor layer has a striated structure, in which filaments of superconducting material are spaced apart from each other creating multiple current flow paths.

9. The superconductor component of claim 1, wherein the superconductor component is a rotating machine, the rotating machine comprising at least one winding, wherein the at least one winding comprises the superconducting conductor.

10. The superconductor component of claim 1, wherein the component is a power cable, the power cable including a plurality of conductors, each conductor comprising said core and said superconductor layer.

11. The superconductor component of claim 10, further comprising a conduit for passage of coolant fluid, wherein the conductors are wrapped around the conduit.

12. The superconductor component of claim 1, wherein superconductor assembly being bonded to the core such that the superconductor layer is radially closer to the core than the substrate to the core.

13. The superconductor component of claim 12, wherein the superconductor layer is in compression.

14. The superconductor component of claim 13, wherein the superconductor layer has opposite major surfaces, the radially innermost major surface being in compression.

15. The superconductor component claim 1, wherein the superconductor layer has an a-b crystal plane and a crystallographic c-axis that is perpendicular to the a-b crystal plane, wherein the crystallographic c-axis extends along a radial direction of the core.

* * * * *